(12) United States Patent
Schoenborn et al.

(10) Patent No.: US 9,076,499 B2
(45) Date of Patent: Jul. 7, 2015

(54) REFRESH RATE PERFORMANCE BASED ON IN-SYSTEM WEAK BIT DETECTION

(71) Applicant: Intel Corporation, Santa Clara, CA (US)

(72) Inventors: Theodore Z. Schoenborn, Portland, OR (US); Christopher P. Mozak, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 200 days.

(21) Appl. No.: 13/730,413

(22) Filed: Dec. 28, 2012

(65) Prior Publication Data

US 2014/0189229 A1 Jul. 3, 2014

(51) Int. Cl.
| | |
|---|---|
| G06F 11/00 | (2006.01) |
| G11C 7/02 | (2006.01) |
| G11C 11/406 | (2006.01) |
| G11C 29/02 | (2006.01) |
| G11C 29/50 | (2006.01) |
| G11C 11/40 | (2006.01) |

(52) U.S. Cl.
CPC ............ *G11C 7/02* (2013.01); *G11C 11/40611* (2013.01); *G11C 2211/4062* (2013.01); *G11C 11/40* (2013.01); *G11C 29/023* (2013.01); *G11C 29/028* (2013.01); *G11C 29/50016* (2013.01)

(58) Field of Classification Search
CPC ........................................................ G11C 7/02
USPC ............................ 714/47.1, 47.2, 42, 54, 47.3
See application file for complete search history.

(56) References Cited

U.S. PATENT DOCUMENTS

| | | | |
|---|---|---|---|
| 7,617,424 B2 | 11/2009 | Frodsham et al. | |
| 8,195,996 B2 | 6/2012 | Fordsham et al. | |
| 8,819,474 B2 | 8/2014 | Schoenborn et al. | |
| 8,868,992 B2 | 10/2014 | Spry et al. | |
| 2004/0233706 A1 | 11/2004 | Burgan | |
| 2005/0068829 A1 | 3/2005 | Oh | |
| 2007/0030746 A1 | 2/2007 | Best et al. | |
| 2007/0088520 A1 * | 4/2007 | Hagerott et al. | 702/108 |
| 2012/0144106 A1 | 6/2012 | Bains | |
| 2013/0173970 A1 * | 7/2013 | Kleveland et al. | 714/710 |
| 2014/0095946 A1 | 4/2014 | Mozak et al. | |
| 2014/0095947 A1 | 4/2014 | Mozak et al. | |
| 2014/0157053 A1 | 6/2014 | Mozak et al. | |
| 2014/0157055 A1 | 6/2014 | Mozak et al. | |
| 2014/0157065 A1 * | 6/2014 | Ong | 714/718 |

FOREIGN PATENT DOCUMENTS

WO    WO-2011067795 A1    6/2011

OTHER PUBLICATIONS

PCT International Search Report and Written Opinion of the International Searching Authority for Int'l Application No. PCT/US2013/047421, dated Oct. 15, 2013, 9 pages.

* cited by examiner

*Primary Examiner* — Dieu-Minh Le
(74) *Attorney, Agent, or Firm* — Blakely, Sokoloff, Taylor & Zafman LLP

(57) ABSTRACT

A memory subsystem can test a memory device in situ, testing the performance of the device in the system it is built into during production. Thus, the refresh rate can be adjusted specific to the memory device(s) of a specific system, rather than defaulting to a refresh frequency specified by a standard for the memory device(s). A test component embedded within the host memory subsystem can perform a test and identify specific bits or lines of memory that produce errors when a lower frequency refresh rate is used. The system maps out the identified bits or lines to prevent the bits/lines from being used in runtime of the system. The memory subsystem can then set its refresh rate to an adjusted refresh rate at which a threshold number of errors can be removed by mapping out the bits/lines.

23 Claims, 8 Drawing Sheets

US 9,076,499 B2

REFRESH RATE PERFORMANCE BASED ON IN-SYSTEM WEAK BIT DETECTION

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2012, Intel Corporation, All Rights Reserved.

FIELD

Embodiments of the invention are generally related to memory subsystems, and more particularly to setting a refresh rate specific to a particular system.

BACKGROUND

Memory devices find ubiquitous use in electronic devices, such as in consumer electronics. Memory devices are typically used to store executable code and data for the runtime operation of the electronic device. Many electronic devices stay operating almost continuously for long periods of time, potentially transferring large amounts of data in and out of the memory devices. Thus, memory devices are tested to determine if they will perform according to design expectations to handle the stresses of runtime operation.

The design expectations are set to minimum or standard performance levels based on expected system yields across all systems. Some memory devices may be capable of operating at higher performance, but are only set to operate in accordance with minimum design expectations. The memory devices are traditionally tested prior to being placed in production-level systems, but such testing only identifies whether or not the memory devices meet the minimum or standard design expectations.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1:
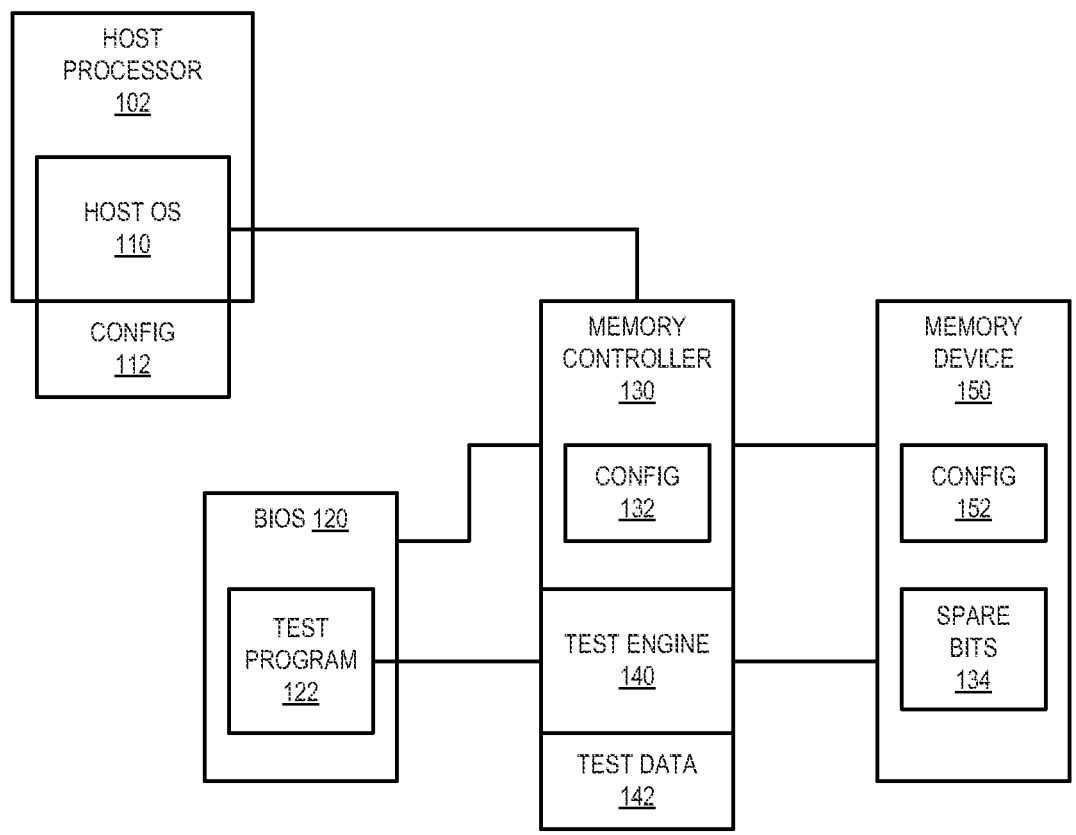
FIG. 1 is a block diagram of an embodiment of a system having a test engine that provides testing in-system.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, a memory subsystem can test performance of a memory device in the system it is built into (e.g., consumer device) for runtime operation. Based on the testing, the refresh rate can be adjusted specific to the memory device(s) of the specific system, rather than defaulting to a refresh frequency specified by a standard for the memory device(s). A test component embedded within the host memory subsystem can perform one or more tests and identify specific bits or lines of memory that produce errors when a lower frequency refresh rate is used. The system maps out the identified bits or lines to prevent the bits/lines from being used in runtime of the system. The memory subsystem can then set its refresh rate to an adjusted refresh rate at which a threshold number of errors can be removed by mapping out the bits/lines.

One of the major energy usage components of memory devices is the power used to perform refresh operations, whether self-refresh or active refresh. Volatile memory devices (devices whose state is indeterminate if power is interrupted to the device) typically have a limit on how long data can be reliably maintained in the memory cells. The memory cells have a retention cycle which starts when they are charged, and falls off to a point at which the state of the cell is not reliably determinable. Refreshing the device includes charging up a memory cell, which starts the retention cycle over. However, the refresh process costs power and time.

Memory cell reliability can be pictured as a bell curve (see FIG. 2), with most cells operating at close to the same level, and some outlying cells being "weaker" than the others. As used herein, a weak bit or a weak cell is one whose performance is worse than and falls outside the mean of the other bits or cells in the memory device. The performance of the memory device is frequently based on the performance of the weakest bits. The following disclosure generally only refers to "bits" for simplicity in description, which will be understood to refer to bits, cells, lines, pages, or other portion of the memory device that is detected to be weak or produce an error, and is to be mapped out.

As described herein, the testing can specifically identify weak bits in a memory device, and map the weak bits out.

Mapping out the weak bits involves one or more techniques used to disallow those bits from being used during runtime operation of the memory device, as described in more detail below. Thus, by testing the memory device, and identifying and mapping out weak bits of the memory device, the refresh performance can be improved. Thus, the memory devices are expected to consume less power and provide higher bandwidth, resulting in longer battery life for devices using the memory devices.

The testing provides stress on the memory device from the perspective of refresh time or refresh rate. For example, the testing can lower the refresh time and monitor the memory device for the bits that fail first. By mapping out these bits, it is anticipated that the overall refresh cycle can be lengthened. From one perspective, the memory device and memory subsystem is specifically tested in-system to determine whether the subsystem can be operated beyond the specification. The memory devices and subsystems described herein are presumed to pass specification, and as such comply with a standard or a specification that applies to the memory device with respect to timing parameters, error rate, and other operating parameters. Thus, based on what is described herein, a commodity device can be made to operate at a higher performance than the performance for which it is rated. The testing can be performed based only on the system itself, without the need for outside test equipment.

Regarding the testing, a test system as referred to herein includes hardware elements located in and/or near the memory controller (e.g., on a shared die space, on a SoC (system on a chip)). The test system can create precise combinations of I/O (input/output) that result in I/O-induced power supply noise, inter-symbol interference (ISI), signal crosstalk, and/or other conditions. Any of these effects can be created by precisely controlling the data on each I/O lane, the pattern on each command lane, and/or how the data signals align with each other across lanes. Additionally, the test system can monitor the performance of the memory devices when refresh rates or other operating parameters of the system are adjusted.

In one embodiment, the test system is configured to create any of a variety of test pattern signal conditions, which enables the test system to create the desired effects to test the memory subsystem. Such pattern signal conditions can include: pseudo random patterns on all lanes, walking one patterns, walking zero patterns, row stripes, column strips, checkerboards, and/or others; applying one pattern to a victim lane while adjacent aggressor lanes get a different pattern, which can further include rotating the victim lane; driving a single frequency tone pattern to excite resonances; combinations of resonance patterns and pseudo random patterns to simultaneously create supply noise and ISI/crosstalk; fixed-pattern hardware training modes (e.g., providing a fixed 1010 pattern for read training), and/or others. In one embodiment, the test system can generate a fixed pattern that allows software to control the values on every lane (e.g., data lane or command lane) in every cycle independently to find a worst case pattern via advanced search techniques. In addition to the ability to generate each of the pattern conditions mentioned, the test system sits close to the memory controller scheduler, which enables the test system to generate all of the pattern types at high speed in hardware.

In one embodiment, a test engine is located prior to the memory controller in the data/request path to test data and commands by injecting memory access transactions into the memory controller. In one embodiment, a test engine or part of a test engine is part of the memory controller itself, and sits prior to the scheduler. Thus, the test system can provide data to be scheduled by the scheduler of the memory controller. As a result, any test traffic is sent to the memory device in a way compliant with memory device access protocol. Thus, errors in the reading back should indicate actual errors in the memory subsystem.

In one embodiment, the test system generation is performed by leveraging a write data buffer or comparable structure on or near the memory controller. Description herein is made in reference to a write data buffer, but such descriptions will be understood to apply equally to a comparable array structure where rows and columns of bits can be selected to generate patterns as described herein. In one embodiment, the write data buffer or comparable structure acts as a lookup table to generate Boolean functions of the select lines of the array. In one embodiment, the pattern generation includes incrementing through lines of the buffer array to allow for multiple stress patterns. In one embodiment, the test system includes logic to save and/or restore state from a pattern selection generator (PatternSelGen).

In general, memory access transactions referred to herein indicate to the memory controller what to do, but not how to do it. The memory controller controls tracking the current state of memory and how to access a location based on the current state of memory. Thus, the memory controller determines how to Activate and/or Precharge the proper pages, issue appropriate CAS/RAS commands, obey all relevant timing related to accessing the memory device, and otherwise comply with memory device access protocols.

The test engine as described herein can be used to test memory devices. Any memory subsystem that uses a memory controller with a scheduler or equivalent logic can implement at least one embodiment of the test engine. Reference made herein to memory devices can include different memory types. For example, memory subsystems commonly use DRAM, which is one example of a memory device as described herein. Thus, the test engine described herein is compatible with any of a number of memory technologies, such as DDR4 (dual data rate version 4, specification in development as of the filing of this application), LPDDR4 (low power dual data rate version 4, specification in development as of the filing of this application), WIDEIO (specification in development as of the filing of this application), and others.

FIG. 1 is a block diagram of an embodiment of a system having a test engine that provides testing in-system. System 100 includes a memory subsystem including memory controller 130 and memory device 150. System 100 represents a production system, or a system in which memory device 150 is placed to be used by a consumer. System 100 includes a hardware platform (not explicitly shown) on which host processor 102 resides, as well as the memory subsystem including memory controller 130 and memory device 150. BIOS (basic input/output system) 120 also resides on the hardware platform.

Host processor 102 executes, among other things, host operating system (OS) 110. Host OS 110 generally provides operational control of system 100 during runtime. Host OS 110 provides software to hardware and hardware to software interfaces to allow a user to interact with system 100. BIOS 120 provides start-up control over system 100 until host OS 110 is loaded.

Host OS 110 provides memory access requests to memory controller 130 for access to memory device 150 for read and/or write of data. Similarly, BIOS 120 can provide memory access requests to memory controller 130. Memory controller 130 accesses memory device 150 in response to data access requests. In one embodiment, test engine 140 generates data access requests and/or access transactions for memory controller 130 to send to memory device 150. In one embodiment, test engine 140 can directly provide test data to memory device 150.

In one embodiment, BIOS 120 initiates a test via test program 122, and accesses test engine 140 to generate test data 142 to test memory device 150, either directly or via memory controller 130. In one embodiment, test data 142 represents data stored during monitoring of testing memory device 150, such as data that is used to identify weak bits (or lines, pages, or other portion) of memory device 150. In response to identifying weak portions of memory device 150, system 100 can map out the weak bits. Mapping out weak portions of memory device 150 can be performed at different granularities. For example, at memory controller 130 or at memory device 150, the granularity can be: cacheline, column or row, page, and/or rank. At host OS 110, the granularity may be an address or address range.

There are a number of different ways bits of memory can be mapped out. Configuration 152 represents a mechanism within memory device 150 that can be used to disallow the use of certain bits. In one embodiment, the bits can be remapped to spare bits 134. In one embodiment, the bits are simply not used, and no remapping is done. In one embodiment, configuration 132 represents a mechanism at memory controller 130 to map out weak bits. For example, memory device 150 can leave the bits unaffected, but memory controller 130 will not write to or otherwise use the bits. Thus, configuration 132 can represent information used by a scheduler of memory controller 130 to schedule access to memory device 150. In one embodiment, the bits are mapped out at the level of host OS 110. Configuration 112 represents a mechanism that host OS 110 uses to avoid access to specific bits of memory device 150. The mechanisms at host OS 110 and memory controller 130 can include, for example, tables or logs of restricted addresses. Other implementations may use reserved locations and/or alternative memory storage to remap a region of memory with weak bits to a known good location. For example, a request to weak region A can be automatically rerouted to region B. In one embodiment, mapping out weak bits includes marking the specific bits as invalid, resulting in a reduction of the memory space available.

In one embodiment, mapping out weak bits can enable system 100 to operate with a lower refresh frequency or rate. Thus, refresh would occur less frequently. The testing described herein can enable empirically testing system 100, and determining a lowest operating refresh rate and/or self-refresh rate for the hardware platform that will still maintain performance quality (e.g., data protection management (DPM) goals). The testing can specifically involve adjusting the refresh rate to a lower frequency to test for weak bits at each lower frequency. In one embodiment, the refresh frequency selected is one step up from a frequency at which the test system detects a threshold number of failures. The threshold can be a total number of bits or lines that can be remapped. Alternatively, the threshold can be a total number of bits that can be removed from the specific system, e.g., evaluating a tradeoff between memory capacity and system performance, such determining that a 0.1% reduction in memory capacity can be sacrificed for a percentage increase in performance, or some other evaluation or determination.

The test system can determine that a bit is a weak bit if, for example, the bit fails to return a value written to it, or if the timing of the response is incorrect. A bit is a weak bit if it typically operates correctly, but begins to show errors in response to stress testing. Most of the bits will continue to operate correctly, even under the stress of operating beyond a specification. Those bits that produce errors in response to the stress can be specifically identified and mapped out. After mapping out the weak bits, the system can operate at a lower refresh rate.

It will be understood that the same tests as currently known for testing memory devices can be used to test the memory devices in-system, in terms of content of the test. The difference is that the test is performed by an embedded test system, which results in certain bits or address lines of the memory device being mapped out (and potentially remapped).

Figure 2:
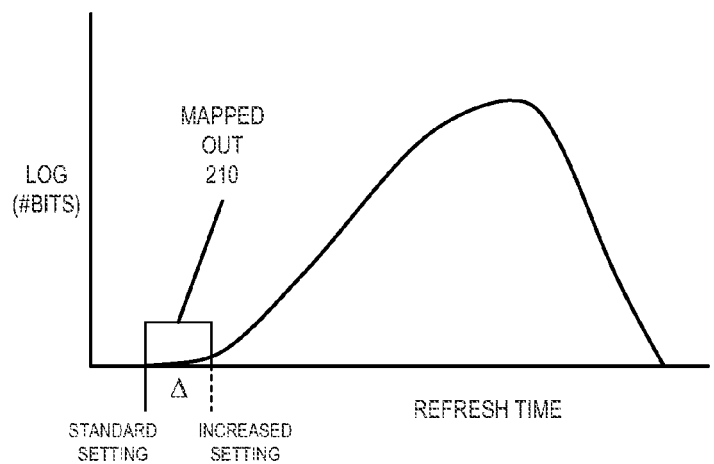
FIG. 2 is a graphical diagram of an embodiment of refresh rate versus number of bits that meet performance at the refresh rate, including an indication of bits to map out.

FIG. 2 is a graphical diagram of an embodiment of refresh rate versus number of bits that meet performance at the refresh rate, including an indication of bits to map out. As illustrated, as refresh time increases, the majority of the bits can still perform reliably. The outlying bits are closest to the intersection of the #bits axis with the refresh time axis. The weak bits are outlying bits 210, which perform worse than the majority of the bits in the memory device. A test system identifies outlying bits 210 to map them out.

Prior to mapping out bits 210, the system in which the memory device is included performs refresh at the standard refresh time. There is some delta between the standard refresh time and the increased setting that can be used once the weak bits are mapped out. The increased setting refers to a setting that demands higher performance from the memory device, which in this case is a higher period of time in between refreshes. Operating the memory device at the higher performance setting operates the device beyond the specification, which can decrease power usage, and potentially increase the bandwidth of the system.

A memory device can include spare bits, which the memory device can use to remap weak bits. The test system can detect and specifically identify weak bits that cannot operate at a lower frequency refresh rate. In one embodiment, the test system indicates the weak bits to the memory device, which can then remap the bits. In one embodiment, the test system indicates the bits to the memory controller, which in turn writes a configuration setting to one or more registers of the memory device to cause the memory device to use the spare bits instead of the weak bits. DRAM devices in particular typically have spare cells, and the memory device can fuse out one line and map in the spare.

In one embodiment, the total number of mapped out bits 210 is equal to a total number of bits that can be remapped to spare bits in the memory device. Thus, for example, the test system can detect weak bits, and remap them starting at the weakest bit. The weakest bits are identified as the first to fail under the least amount of stress. Thus, for example, the bits that fail at the highest refresh rate (the lowest refresh time). In one embodiment, the test system monitors for failures until a threshold number of weak bits has been detected.

Figure 3:
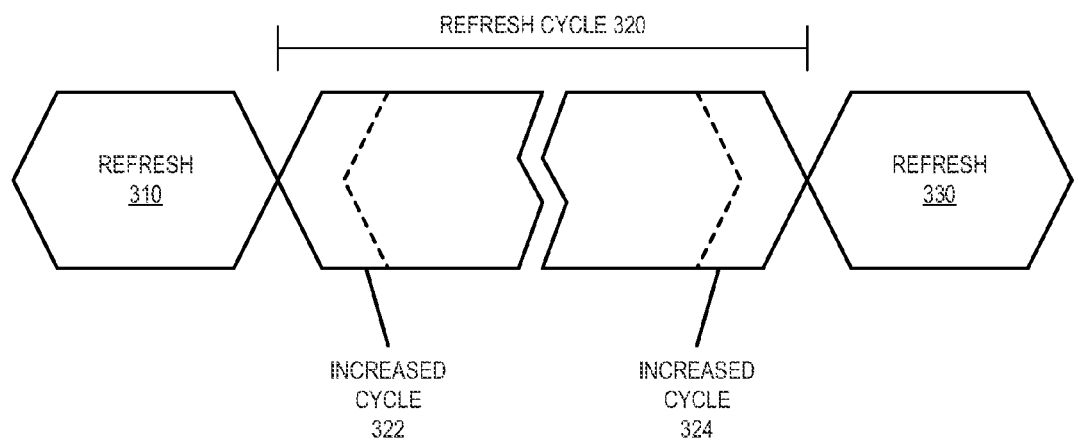
FIG. 3 is a block diagram of an embodiment of an operation or command sequence, including an indication of a reduction of refresh rate.

FIG. 3 is a block diagram of an embodiment of an operation or command sequence, including an indication of a reduction of refresh rate. Refresh commands 310 and 330 are separated by refresh cycle time 320. Refresh cycle time 320 is increased as described herein in response to the detection of weak bits. In one embodiment, refresh cycle time 320 is increased by adjusting a timer associated with the refresh timing. The adjustment to the refresh timer could be performed in at least one of two ways. In one embodiment, the value to be reached by the timer can be set to a higher value, which would result in an increased cycle as represented by increased cycle 324 (i.e., the cycle is increased at the end by the timer being a higher value). In one embodiment, the system can make a delay before the timer is started, as represented by increased cycle 322. Refresh cycle time 320 can be an active refresh cycle time, or a self-refresh cycle time. In one embodiment, the two different refresh times are adjusted separately. In another embodiment, both refresh times are adjusted concurrently.

Figure 4:
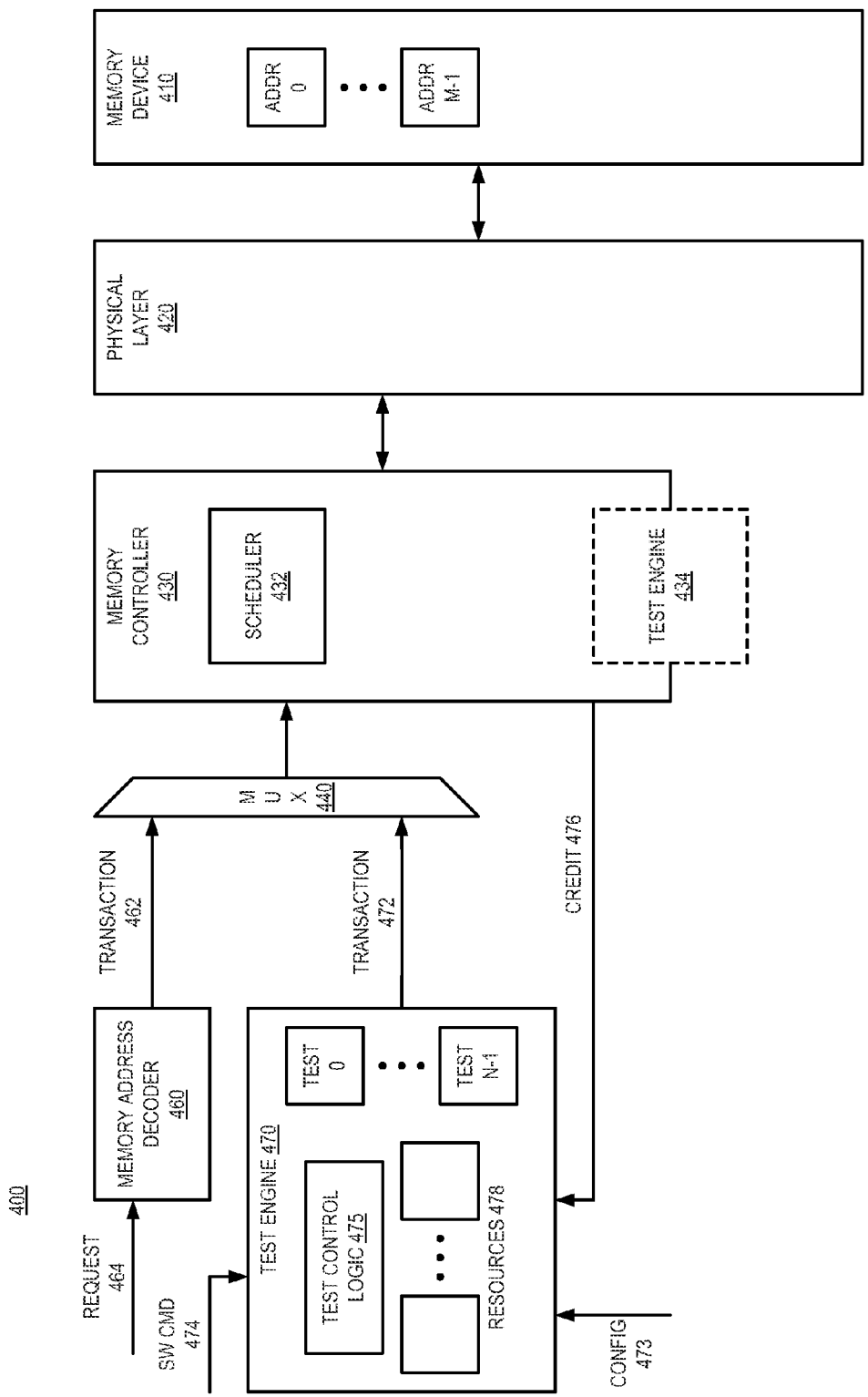
FIG. 4 is a block diagram of an embodiment of a system having a test engine with configurable hardware resources that provides transaction-level, in-system testing.

FIG. 4 is a block diagram of an embodiment of a system having a test engine with configurable hardware resources that provides transaction-level, in-system testing. System 400 is one example of an embodiment of a system with a test engine that provides in-system testing. Memory device 410 stores data and/or instructions for execution by a processor. The operation of memory device 410 is tested by a test engine (e.g., test engine 470 and/or test engine 434). As discussed herein, when a test engine detects a weak bit in memory device 410, system 400 maps out the weak bit.

Physical layer 420 provides the architecture to connect one or more memory devices 410 to memory controller 430. Physical layer 420 can include registers, interconnection lines, physical buses, and other components of a memory device that handle I/O (input/output) to/from memory device 410. In one embodiment, physical layer 420 can include components of a dual inline memory module (DIMM), which can include multiple individual DRAMs.

Memory controller 430 includes scheduler 432 to schedule (e.g., control ordering and timing of commands, implement an access protocol) memory device commands to send to memory device 410 (e.g., via physical layer 420). Memory controller 430 generates memory device commands for memory device 410 to execute. Scheduler 432 schedules the memory device commands generated in response to the memory access transactions received at memory controller 430.

Memory address decoder 460 provides a standard path for memory requests to reach memory controller 430, for example, from a host processor. Memory address decoder 460 receives request 464 from a source such as the host processor. Request 464 generally includes an access command and address information. The address can be a logical address, which does not identify the actual physical address of the memory location(s) to which the memory access is directed. Memory address decoder 460 includes logic that enables it to resolve the physical address from the virtual address information to create transaction 462. In one embodiment, transaction 462 includes a command identifier, and identifies the specific rank, bank row, and column for the command.

System 400 includes test engine 470, which receives software command 474 from a test source (a BIOS device), and generates memory access transactions 472 for scheduling by memory controller 430 and execution by memory device 410. In one embodiment, transactions 472 are of the same form as transactions 462, with a command identifier (e.g., a read identifier or write identifier), and identifier for the specific rank, bank row, and column for the command. In one embodiment, memory controller 430 generates credit 476 as feedback to test engine 470. Memory controller 430 can use credit 476 to provide indicators of the timing of processing transaction 472. Thus, for example, memory controller 430 can indicate when a transaction has been processed.

In one embodiment, test engine 470 uses credit 476 to control the determinism of the testing. For example, test engine 470 can use a single credit policy in that it will only send out one transaction or command at a time. In one embodiment, test engine 470 waits to send out a subsequent transaction until memory controller 430 returns credit 476 indicating the first transaction has been issued. Thus, even if scheduler 432 uses out of order scheduling or just in time scheduling, test engine 470 can send one transaction at a time, which ensures that scheduler 432 will not reorder the test.

In one embodiment, system 400 includes multiplexer 440 or equivalent logic (e.g., logic within memory controller 430) to select between transaction 462 of memory address decoder 460 or transaction 472 of test engine 470. Although the expression "multiplexed" may be used, it will be understood that if the operation of memory address decoder is temporarily suspended, and/or higher-level operations at the processor level are suspended to prevent issuing of memory access requests, transaction 472 can be the only input available during testing. Thus, in one embodiment, mux 440 can be implemented as a simple buffer that can be written by either memory address decoder 460 or test engine 470. Alternatively, mux 440 can be a multiplexer that selects between transaction 462 and transaction 472 responsive to a set signal (not explicitly shown). Such a signal could be generated, for example, by test engine 470 or an external signal controllable by the test source. In one embodiment, such a set signal could be used as a security feature to prevent access to the test engine by malicious code that could be trying to access protected memory contents through the test engine, which it would otherwise not have access to. Thus, selecting the multiplexer can be understood in one embodiment as providing security to the test engine.

In one embodiment, test engine 470 includes dynamically configurable hardware resources 478. For example, in one embodiment, test engine 470 includes one or more configurable/programmable logic arrays or configurable logic devices controlled by test control logic 475. It will be understood that configurable/programmable logic devices can be configured via software control. As mentioned above, the software control can be through a local device, or via a remote administration device. Thus, in one embodiment, configuration (config) 473 is provided by the test source that generates software command 474. In one embodiment, configuration 473 represents a setting of one or more registers or configuration controls in test engine 470, and software logic to program test engine resources 478 can come from a storage device (not shown).

Resource 478 can be used to implement any of a number of different tests, and the configuration of the resources can be different for the different tests, although some configuration settings may overlap between tests. In one embodiment, resources 478 are arranged to implement different FSMs (finite state machines) in response to configuration 473.

Memory device 410 has memory elements (e.g., cells) with addresses ADDR0 through ADDR(M−1). The M addresses could be the range of all addresses in memory device 410, or alternatively could be a range less than the whole device over which a test sequence is to be iterated.

Test engine 470 is shown to include test0 through test(N−1). The N tests can represent different iterations through the same test (e.g., the same test transaction with N different addresses), in which case N and M could be considered equal. The N tests can represent N different tests that are each iterated through the M addresses. As illustrated, test engine 470 includes N different configurations of resources 478 to execute the N different tests. Configuration 473 is provided to configure the N different test setups of resources 478. In one embodiment, a single software command 474 operates to cause test engine 470 to generate M transaction 472 to iteratively test ADDR0 through ADDR(M−1). In one embodiment, multiple tests are generated and passed to the memory controller to be executed in parallel.

In one embodiment, the address range M can be decomposed further into {Rank[Ra−1:0], Bank[B−1:0], Row[R−1:0], Column[C−1:0]} starting and stopping addresses for a test, where the rank, bank, row, and column are understood to be of sizes Ra, B, R, and C, respectively. It will be understood that hardware can adjust the Row/Column/Bank range based on exact organization for each rank of memory device 410 (e.g., a 2 Gb DRAM will have a different number of rows than a 4 Gb DRAM). It will be understood that hardware can adjust the Rank range based on the exact system population (e.g., a system could be populated with single rank or quad rank DIMMs). In one embodiment, test engine 470 includes test control logic 475, which represents logic that enables test engine to modify its configuration based on configuration signal 473. Test control logic 475 manages the configuration of resources 478.

Test engine 470 supports use of incrementing and decrementing (negative incrementing) in sequences, by different rates and values, and across different fields or subfields. Different rates and values can apply to different ranks, rows, columns, or other address settings to generate any pattern types and test sequence. Examples can include diagonal patterns, stripes, checkerboards, programmable-sized hypercubes of a current address, or other patterns.

In one embodiment, test engine 470 is implemented in the same die space, or as an SoC (system on a chip) with the memory controller die. In one embodiment, system 400 includes test engine 434, which can perform similar functions of test engine 470, and is implemented as part of memory controller 430. In one embodiment, test engine 434 allows the testing of other aspects of system 400, such as allowing injection of test data onto the interconnections between memory controller 430 and physical layer 420. In one embodiment, test engine 434 includes a write data buffer (WDB) or other logic buffer on memory controller 430. In one embodiment, test engine 470 and/or test engine 434 is implemented as a hardware finite state machine (FSM). The test engine(s) can be dynamically programmable hardware FSMs.

In one embodiment, memory controller 430 includes one or more counters (not explicitly shown). Examples include, but are not limited by, a refresh counter, a ZQCal (impedance calculation) counter, a power down counter, or other counters. In one embodiment, test engine 470/434 performs a reset of memory controller 430 in conjunction with a memory test. The reset can include resetting one or more counters. The resetting can be performed in response to an event in memory controller 430, such as the execution of a command, or the occurrence of an alert, interrupt, error, or other condition. In one embodiment, the counters can be reset to a programmable reset value specific to a counter and/or specific to a particular test or test event.

Test engine 470 and/or test engine 434 can be used to test data lanes and/or command lanes. It will be understood that a data line or data bus is typically separate from a command/address (C/A) bus on which commands are sent from memory controller 430 to memory device 410. Similar techniques can be used to create stress traffic on the data bus, and/or the C/A bus.

In one embodiment, test engine 434 includes one or more components that enable the test system to record or log errors. The most common error would be a mismatch between data written to the memory device and a read of the written data. The recording of information can include recording address information and write information. The recorded information can include information identifying how many transactions have occurred since the start of the test (before the error occurred), a total number of errors, a number of areas for a memory region, or other information. Such information can indicate which bits in memory device 410 are weak.

Figure 5B:
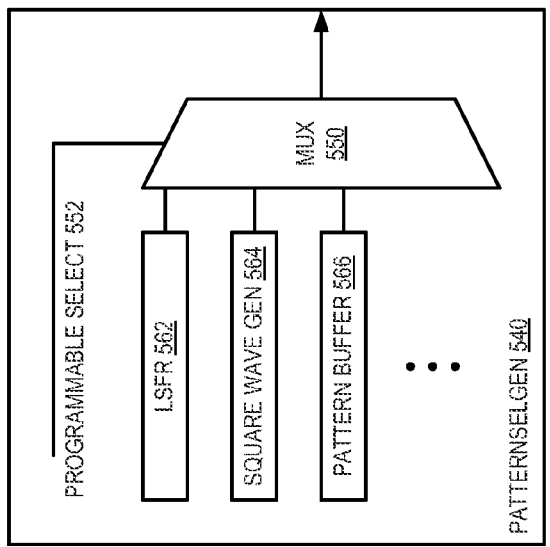
FIG. 5B is a block diagram of an embodiment of programmable pattern selection generator.
Figure 5A:
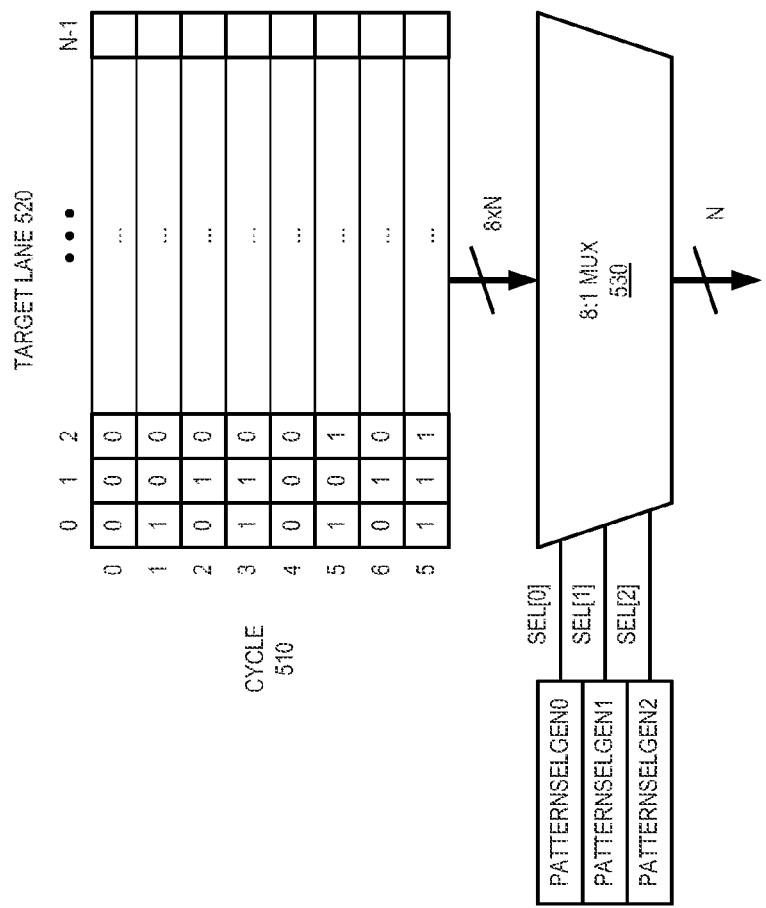
FIG. 5A is a block diagram of an embodiment of a test signal generator including a bit array selectable by pattern generators.

FIG. 5A is a block diagram of an embodiment of a test signal generator including a bit array selectable by pattern generators, which can be used to detect weak bits in a memory subsystem. The signal generator provides one example embodiment of a generator in accordance with any embodiment described herein. In one embodiment, the generator can be or be used with any WDB or comparable structure described herein. The generator includes a bit array of M×N bits, where M=8 in the drawing. In one embodiment, the bit array includes 32 cachelines, which assuming a burst length of 8, would mean M=8*32=256. Other values of M are possible. N is a width that provides a desired amount of storage. In one embodiment, N is a width of the data bus. As one example, N=64. Other values of N are possible. In general, it will be understood that there are numerous ways to generate write data for a memory device. The significant part is not necessarily the amount of storage space, which can be designed and/or configured based on implementation, but rather the fact that there is storage space that can be used to generate data patterns.

As illustrated, the bit array has rows representing cycle 510, or cycles of bit generation, and columns representing data lanes 520. As discussed previously, the lanes could be wider than a single bit. It will be understood that to select which cycle 510 to use, mux 530 should be triggered with a number Y of select lines where 2^Y is greater than or equal to M. Thus, three PatternSelGen blocks are shown, PatternSelGen0, PatternSelGen1, and PatternSelGen2. It will be understood that the three different PatternSelGen blocks represent different pattern selection logic. In one embodiment, the different pattern selection logic is used to produce combinations of different types of pattern logic, which produces different combinations of bits in the array. The different logic type is explained in more detail below with respect to FIG. 5B. The selection logic, PatternSelGen produces SEL[2:0] to control mux 530. Mux 530 is one embodiment of a parallel to serial mux (PISO). It will be understood that there can be other, separate PISO paths in a practical system, such as one on a command bus.

As seen, the bit array includes a simple binary sequence for columns 0-2, starting with 000 in row0, and ending with 111 in row7. Other bit array values are possible. There could also be any number of bits sequence patterns in the other columns of the bit array. The bit array structure could be used with no changes to the bits in the rows to provide M fully programmable data patterns. For example, the programmability capability could be used by training algorithms to generate fixed patterns (e.g., MPR 1010 pattern for DDR3 DIMM). In one embodiment, the bit array is used by search algorithms to attempt to find the worst case pattern by adjusting individual bits.

By adding PatternSelGen logic to Sel[2:0], the signal generation logic can operate as a lookup or truth table the encodes a specific Boolean combination of the Sel[2:0] inputs. For example, as shown in the binary sequence of columns 0-2, DQ [0] data is programmed to be 1 whenever Sel[0] is 1. Thus, DQ [0] is programmed to always output Sel[0]. Similarly, DQ[1]=Sel[1], and DQ[2]=(Sel[0]&Sel[2]). In general, such a lookup table approach allows any columns/lanes to be programmed to generate any Boolean combination of {Sel[0],Sel[1],Sel[2]}. Thus, a single PatternSelGen block can be shared by all the columns/lanes and be assigned to any given column/lane with almost no overhead logic.

FIG. 5B is a block diagram of an embodiment of programmable pattern selection generator that can be used to detect weak bits in a memory subsystem. PatternSelGen 540 is one example embodiment of PatterSelGen logic such as used in FIG. 5A. In one embodiment, each PatternSelGen block (e.g., 0, 1, 2) is implemented as PatternSelGen 540, with multiple different logic options for each one. In an alternative embodiment, PatternSelGen 540 is implemented in a more collective fashion rather than having all logic types repeated for each PatternSelGen. For example, PatternSelGen0, PatternSelGen1, and PatternSelGen2 could be three separate muxes 550, which each have a programmable select signal 552, and all three (or other number) multiplexers are connected to the same logic blocks. In another alternative embodiment, the output of mux 550 could be fed into multiple different logic buffers, and multiple different iterations of pattern selection can be made to generate the select signal (e.g., SEL[2:0]).

PatternSelGen 540 can have multiple different pattern options built into it, depending on the implementation of the test system. Three possible examples are illustrated: LSFR (linear shift feedback register) 562, square wave generator 564, and pattern buffer 566. Other types are possible, including types that use remapping or hashing of the address (e.g., row, column, rank, bank, output chunk count) to create patterns such as row stripes, column stripes, or checkerboards, and/or others.

LSFR 562 can generate a pseudorandom pattern with minimal hardware cost. LFSR 562 can use either a fixed or programmable polynomial, depending on implementation. In one embodiment, LFSR 562 has a fixed starting seed, and in another embodiment, LFSR 562 has a programmable starting seed. The programmable aspects can be programmed by the memory controller, or by a test system administrator system. In one embodiment, LSFR 562 is implemented on the same hardware as pattern buffer 566.

Square wave generator 564 can be a FSM (finite state machine) that will generate a digital square wave (e.g., X ones followed by Y zeros) with programmable frequency, phase shift, and duty cycle. The programmable aspects can be programmed by the memory controller, or by a test system administrator system. Given that square wave generator 564 can generate a single tone frequency, can be useful at exciting resonance frequencies in the I/O system of the memory subsystem. In one embodiment, a specific resonance frequency is not known precisely. In such a case, square wave generator 564 can be programmed to increment through a range of frequencies (e.g., $f_{START}$ to $f_{STOP}$) and generate a chirp pattern. The chirp can generate a given frequency for a programmable length of time before incrementing to the next value, where the increment could be done in either a linear or exponential fashion. In one embodiment, the test system uses a square wave generator with chirp as a source of traffic.

In one embodiment, pattern buffer 566 can be a rotating shift register programmed with a fixed X-bit long pattern. Thus, the logic buffer can apply a fixed pattern to some lanes without the overhead of needing to program the entire logic buffer. In a simple case, a programmable shift register can be programmed to walk linearly through test values.

Figure 6:
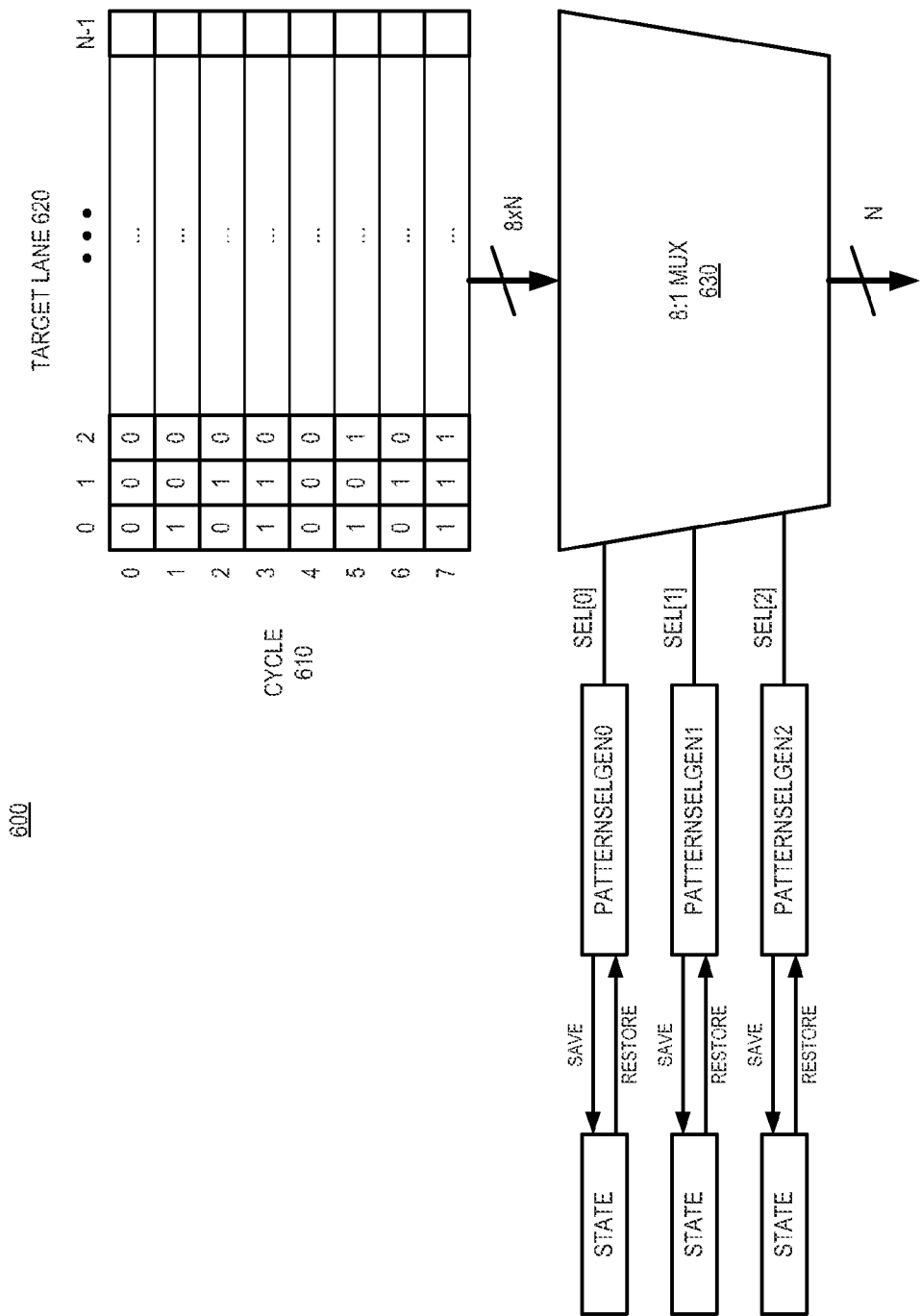
FIG. 6 is a block diagram of an embodiment of a test signal generator including a bit array selectable by pattern generators, where the pattern generators save and restore state.

FIG. 6 is a block diagram of an embodiment of a test signal generator including a bit array selectable by pattern generators, where the pattern generators save and restore state. Logic 600 is one example of a signal generator or signal generator logic in accordance with any embodiment described herein. Similar to what is shown in FIGS. 5A and 5B, logic 600 includes a bit array with rows, cycle 610, and with columns, target lane 620 (which could be either data lanes for data bus stress tests, or command lanes for command bus stress tests). Thus, as illustrated logic 600 includes 8 rows and N columns, but there could be any number of rows needed to implement whatever testing is designed. 8:1 mux 630 (which could alternatively be labeled as an M:1 mux), selects one of the cycles or logical combinations of cycles 610 and outputs it, making an N-bit output to inject onto a data bus as write data.

Many classes of interesting patterns define a victim bit and a group of aggressor bits. As one possible example, suppose a test had eight data lanes, and used LFSR0 for Target[0] (victim) and LFSR1 for Target[7:1] (aggressors). Such a test could be iterated eight times, allowing each lane a chance to be a victim to achieve complete coverage. Other tests may set the victim lane to a static 1 and the aggressor lanes to 0 to create a walking one pattern. A walking zero or other similar pattern could be created in an analogous manner. As illustrated, logic 600 includes eight cachelines of storage, and each victim-aggressor combination could use a single cacheline. Iteration of the test could be achieved by either starting/stopping the test to reprogram logic 600, or increasing the size of the logic buffer. It will be understood that in general, logic 600 could have a number of entries equal to (Number of Victim Lanes)*(2^Number of Sel). With a large enough bit array, the test could simply define a starting and stopping location within the blocks and how fast it should increment from one block to the next, where one block is (2^Number of Sel), and represents a single complete victim pattern.

In one embodiment, a test seeks to have each lane replay the same pattern sequence multiple times during a test, for example, to achieve uniform coverage of the test. For example, continuing the same example from above, the test could have LFSR0 and LFSR1 start with the same initial seed for each victim lane. In one embodiment, logic 600 periodically saves and restores the PatternSelGen state to be able to replay the same pattern sequence multiple times. PatternSelGen state could include, among other things, LFSR seed value, Pattern Buffer value, and/or Square Wave Generator counter values. Thus, the PatternSelGen could have two copies of its state, both initial and current. The current state is the working copy and can be incremented, for example, during the individual transactions. In one embodiment, the initial copy is only updated by software before the test starts or during a save operation. In one embodiment, restore overrides the current state with the initial state. Likewise, a save operation can override the initial state with the current state.

Referring more specifically to logic 600, the selection logic is expanded and more complex than what is shown above in FIG. 5A. In one embodiment, each select line (SEL[2:0]) is selected from multiple potential patterns, for example, by a multiplexer. A simpler case is illustrated for simplicity in illustration. As illustrated, each block, PatternSelGen0, PatternSelGen1, and PatternSelGen2, can save and restore state to reuse a pattern selection multiple times. A save operation stores a current state of the PatternSelGen block into an associated state storage. A restore operation reads the saved state out of the associated state storage to be applied within the PatternSelGen block. The determination to save and/or restore can be triggered in logic by test control logic, either from a memory controller, a test engine, or a remote administration source.

In one embodiment, a WDB including logic 600 can generate both write data and expected read data. Since writes and read will occur at different times, PatternSelGen blocks should be independent between the read and write operations. Such independence allows the write PatternSelGen block to walk through a fixed sequence of traffic (e.g., LFSR increments, Pattern buffer rotations, or others), and its state is only incremented when there is write data. When a read operation is happening, logic 600 can switch to a separate PatternSelGen block that has the same initial condition as write, and can thus replay the same pattern sequence. Such operation can ensure the expected read data will match the write data as long as the number and order of write/read transactions matches, which can be met by making such a constraint on operation of logic 600, either through configuration or runtime programming. One option is to have separate PatternSelGen blocks for read and write. Alternatively, the PatternSelGen blocks can be shared with independent states for read or write transactions. As another alternative, the save/restore flow could be used to provide independent write versus read storage.

Returning to the example above, in one embodiment, the PatternSelGen logic is configured for a particular test or test sequence to restore state every time the cacheline increments. In one embodiment, when logic 600 wraps back to the starting cacheline, the PatternSelGen block can skip the restore operation and replace it with a save operation. Thus, logic 600 could perform a long test that walks through the cachelines multiple times while still making forward progress through the possible test patterns (e.g., LFSR patterns) while providing identical stress on all victim lanes.

It will be understood that logic 600 may be implemented twice in a test system, once for tests related to data bus traffic stress, and another for tests related to command bus traffic stress. The logic could be implemented in different places within the memory subsystem to implement data stress versus command stress.

Figure 7:
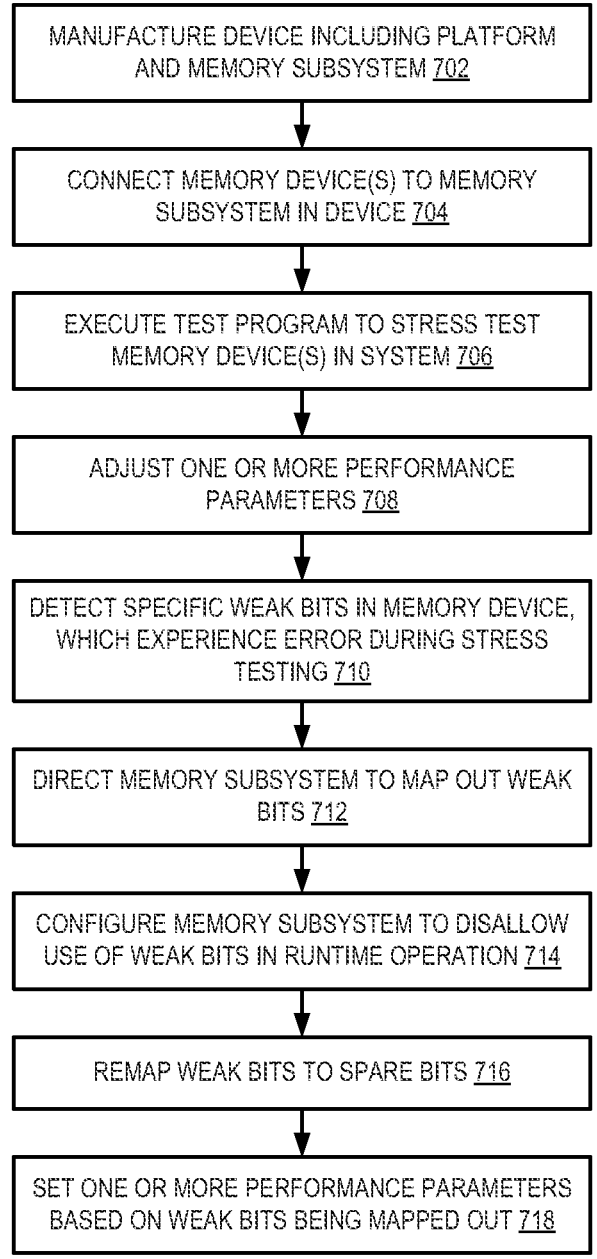
FIG. 7 is a flow diagram of an embodiment of a process for testing a refresh rate and setting a lower frequency for the refresh rate in accordance with in-system testing.

FIG. 7 is a flow diagram of an embodiment of a process for testing a refresh rate and setting a lower frequency for the refresh rate in accordance with in-system testing. A manufacturer manufactures a device including a host hardware platform and a memory subsystem on the platform, 702. The same or a different entity (either a manufacturer or end user) can then connect one or more memory devices to the memory subsystem in the device, 704. When the device is manufactured and when the device(s) are connected to the memory subsystem, the individual components, such as the memory device(s), have already been tested. At the point of manufacture described herein, the components are presumed to comply with standard or minimum performance expected of the components.

A test engine executes a test program to stress test the memory device(s) in-system, 706. The testing can be performed in accordance with any embodiment described herein. The test engine is embedded on the host platform, and does not require external test equipment to perform the testing. In one embodiment, a BIOS on the platform includes a test program or test routine to perform when memory is connected to the memory subsystem. The test program or routine directs the test engine to perform testing to detect weak bits in the memory device(s). In one embodiment, the test engine is triggered from a location remote to the device including the memory device(s) to test, such as over a network connection.

The memory subsystem, at the control of the test program and/or test engine, can adjust one or more performance parameters of the system to monitor performance in response to the change, 708. In one embodiment, as described herein, the specific performance parameter to test is the refresh rate. Thus, the test engine can adjust the refresh rate lower, iteratively over a test sequence, and monitor the performance of the memory device(s). The test engine will record errors and can thus detect specific weak bits in the memory device that experience errors when the device(s) operate at the adjusted parameter during the stress testing, 710. The test system can direct the memory subsystem to map out detected weak bits, 712.

In one embodiment, the test engine can modify the voltage or temperature of the system to create a worst case environment. Creating such a worst case environment can be performed using either direct or indirect control, or both. Direct control refers to changing a voltage regulator target or sending a command to a system thermal control such as fan speed control (not shown). Indirect control refers to options such as activating pages, refreshing pages, enable ODT (on die termination), and/or other operations that are known to consume significant power and thus modulate either voltage or temperature. By controlling the frequency of these operations, a rough control over the voltage or temperature of the system is possible.

In one embodiment, the test system can measure the voltage and/or temperature of the system. For example, many systems already include temperature measurement equipment to prevent the system from getting too hot, resulting in degraded user experience (e.g., device uncomfortable to use) or even long term damage. Such temperature information could be used to scale the test results to worst case environmental conditions that cannot easily be created during testing. For example, based on lab characterization, a mathematical equation could be created to describe the required relative refresh rate at different temperatures. By knowing what temperature the test was run at, the refresh results can be extrapolated to other, worst case temperatures.

It is also possible to combine both of these techniques, control and measurement, together to empirically find two or more points on a mathematical curve. Such a calculation could allow a more accurate prediction of the required settings under worst case conditions, reducing any guardband terms that may otherwise be required. In one embodiment, such calculations are used to extrapolate a worst case scenario, or a worst case performance of the memory device in a worst case environmental condition.

The memory subsystem configures itself to disallow use of the weak bits in runtime operation of the device, 714. As mentioned above, the memory subsystem can map out the weak bits and/or disallow use of the weak bits in the host operating system, the memory controller, and/or the memory device itself. In one embodiment, the memory device remaps weak bits to spare bits, 716.

When the weak bits are mapped out of use in the memory subsystem, the device can operate at a higher performance than when the bits are in use. Thus, the memory subsystem sets one or more performance parameters based on the weak bits being mapped out, 718. Specifically, the memory subsystem sets the refresh rate lower. In one embodiment, similar to what is discussed above, a voltage and/or temperature measurement and mathematical equations can be used to decide on the appropriate parameter value. However, it is determined, the lower refresh rate is what the memory subsystem will use when the device is operated.

Figure 8:
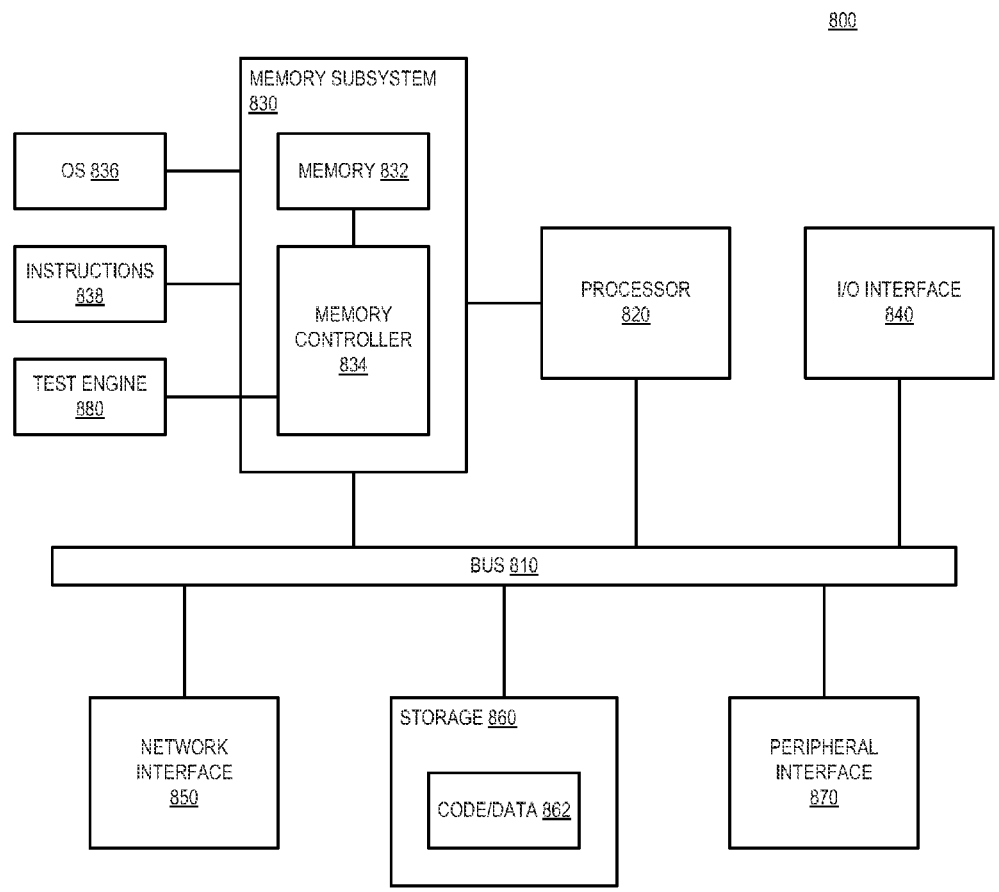
FIG. 8 is a block diagram of an embodiment of a computing system in which in-system testing can be implemented.

FIG. 8 is a block diagram of an embodiment of a computing system in which in-system testing can be implemented. System 800 represents a computing device in accordance with any embodiment described herein, and can be a laptop computer, a desktop computer, a server, a gaming or entertainment control system, a scanner, copier, printer, routing or switching device, or other electronic device. System 800 includes processor 820, which provides processing, operation management, and execution of instructions for system 800. Processor 820 can include any type of microprocessor, central processing unit (CPU), processing core, or other processing hardware to provide processing for system 800. Processor 820 controls the overall operation of system 800, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 830 represents the main memory of system 800, and provides temporary storage for code to be executed by processor 820, or data values to be used in executing a routine. Memory subsystem 830 can include one or more memory devices such as read-only memory (ROM), flash memory, one or more varieties of random access memory (RAM), or other memory devices, or a combination of such devices. Memory subsystem 830 stores and hosts, among other things, operating system (OS) 836 to provide a software platform for execution of instructions in system 800. Additionally, other instructions 838 are stored and executed from memory subsystem 830 to provide the logic and the processing of system 800. OS 836 and instructions 838 are executed by processor 820.

Memory subsystem 830 includes memory device 832 where it stores data, instructions, programs, or other items. In one embodiment, memory subsystem includes memory controller 834, which is a memory controller in accordance with any embodiment described herein, and which includes a scheduler to generate and issue commands to memory device 832.

In one embodiment, system 800 includes test engine 880, which provides memory test transactions to memory controller 834 to have memory controller 834 schedule the transactions to provide deterministic testing. Thus, test engine 880 enables transaction-level memory testing of memory 832 in accordance with any embodiment described herein. The testing can be performed in-system, with the memory devices connected into a hardware platform in which they will be used in runtime.

Processor 820 and memory subsystem 830 are coupled to bus/bus system 810. Bus 810 is an abstraction that represents any one or more separate physical buses, communication lines/interfaces, and/or point-to-point connections, connected by appropriate bridges, adapters, and/or controllers. Therefore, bus 810 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 810 can also correspond to interfaces in network interface 850.

System 800 also includes one or more input/output (I/O) interface(s) 840, network interface 850, one or more internal mass storage device(s) 860, and peripheral interface 870 coupled to bus 810. I/O interface 840 can include one or more interface components through which a user interacts with system 800 (e.g., video, audio, and/or alphanumeric interfacing). Network interface 850 provides system 800 the ability to communicate with remote devices (e.g., servers, other computing devices) over one or more networks. Network interface 850 can include an Ethernet adapter, wireless interconnection components, USB (universal serial bus), or other wired or wireless standards-based or proprietary interfaces.

Storage 860 can be or include any conventional medium for storing large amounts of data in a nonvolatile manner, such as one or more magnetic, solid state, or optical based disks, or a combination. Storage 860 holds code or instructions and data 862 in a persistent state (i.e., the value is retained despite interruption of power to system 800). Storage 860 can be generically considered to be a "memory," although memory 830 is the executing or operating memory to provide instructions to processor 820. Whereas storage 860 is nonvolatile, memory 830 can include volatile memory (i.e., the value or state of the data is indeterminate if power is interrupted to system 800).

Peripheral interface 870 can include any hardware interface not specifically mentioned above. Peripherals refer generally to devices that connect dependently to system 800. A dependent connection is one where system 800 provides the software and/or hardware platform on which operation executes, and with which a user interacts.

Figure 9:
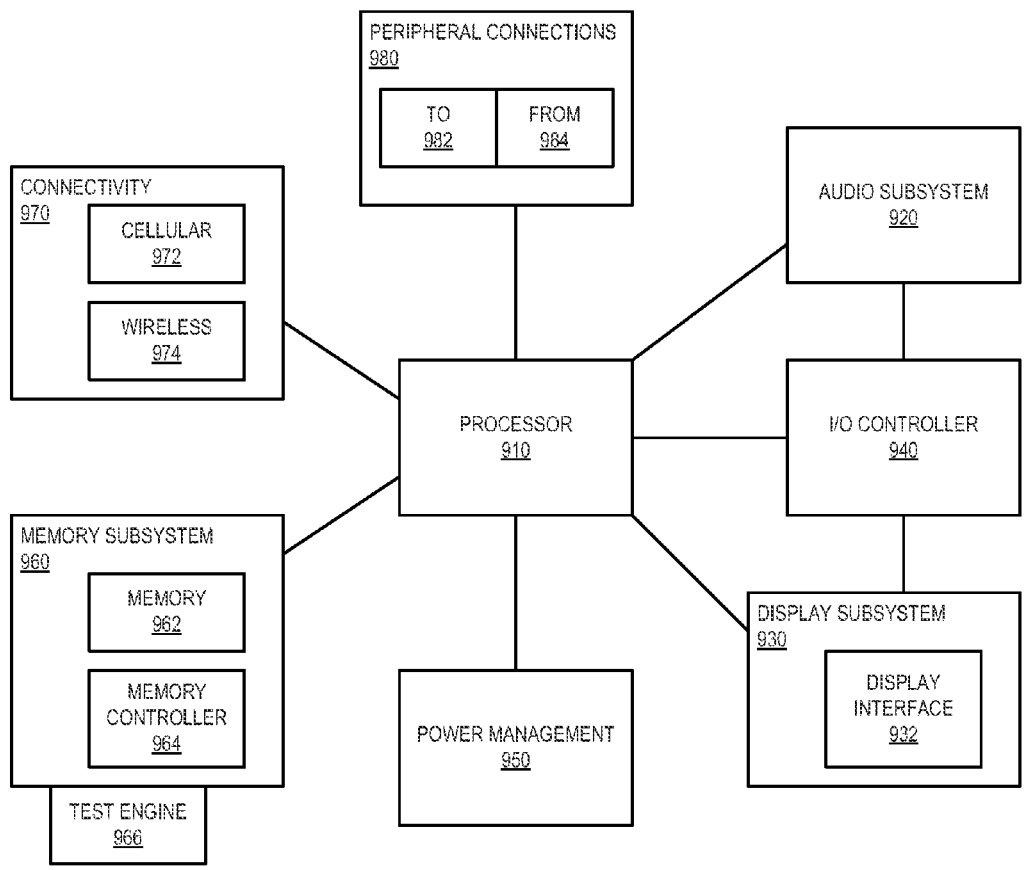
FIG. 9 is a block diagram of an embodiment of a mobile device in which in-system testing can be implemented.

FIG. 9 is a block diagram of an embodiment of a mobile device in which in-system testing can be implemented. Device 900 represents a mobile computing device, such as a computing tablet, a mobile phone or smartphone, a wireless-enabled e-reader, or other mobile device. It will be understood that certain of the components are shown generally, and not all components of such a device are shown in device 900.

Device 900 includes processor 910, which performs the primary processing operations of device 900. Processor 910 can include one or more physical devices, such as microprocessors, application processors, microcontrollers, programmable logic devices, or other processing means. In one embodiment, processor 910 includes optical interface components in addition to a processor die. Thus, the processor die and photonic components are in the same package. Such a processor package can interface optically with an optical connector in accordance with any embodiment described herein.

The processing operations performed by processor 910 include the execution of an operating platform or operating system on which applications and/or device functions are executed. The processing operations include operations related to I/O (input/output) with a human user or with other devices, operations related to power management, and/or operations related to connecting device 900 to another device. The processing operations can also include operations related to audio I/O and/or display I/O.

In one embodiment, device 900 includes audio subsystem 920, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 900, or connected to device 900. In one embodiment, a user interacts with device 900 by providing audio commands that are received and processed by processor 910.

Display subsystem 930 represents hardware (e.g., display devices) and software (e.g., drivers) components that provide a visual and/or tactile display for a user to interact with the computing device. Display subsystem 930 includes display interface 932, which includes the particular screen or hardware device used to provide a display to a user. In one embodiment, display interface 932 includes logic separate from processor 910 to perform at least some processing related to the display. In one embodiment, display subsystem 930 includes a touchscreen device that provides both output and input to a user.

I/O controller 940 represents hardware devices and software components related to interaction with a user. I/O controller 940 can operate to manage hardware that is part of audio subsystem 920 and/or display subsystem 930. Additionally, I/O controller 940 illustrates a connection point for additional devices that connect to device 900 through which a user might interact with the system. For example, devices that can be attached to device 900 might include microphone devices, speaker or stereo systems, video systems or other display device, keyboard or keypad devices, or other I/O devices for use with specific applications such as card readers or other devices.

As mentioned above, I/O controller 940 can interact with audio subsystem 920 and/or display subsystem 930. For example, input through a microphone or other audio device can provide input or commands for one or more applications or functions of device 900. Additionally, audio output can be provided instead of or in addition to display output. In another example, if display subsystem includes a touchscreen, the display device also acts as an input device, which can be at least partially managed by I/O controller 940. There can also be additional buttons or switches on device 900 to provide I/O functions managed by I/O controller 940.

In one embodiment, I/O controller 940 manages devices such as accelerometers, cameras, light sensors or other environmental sensors, gyroscopes, global positioning system (GPS), or other hardware that can be included in device 900. The input can be part of direct user interaction, as well as providing environmental input to the system to influence its operations (such as filtering for noise, adjusting displays for brightness detection, applying a flash for a camera, or other features).

In one embodiment, device 900 includes power management 950 that manages battery power usage, charging of the battery, and features related to power saving operation. Memory subsystem 960 includes memory device(s) 962 for storing information in device 900. Memory subsystem 960 can include nonvolatile (state does not change if power to the memory device is interrupted) and/or volatile (state is indeterminate if power to the memory device is interrupted) memory devices. Memory 960 can store application data, user data, music, photos, documents, or other data, as well as system data (whether long-term or temporary) related to the execution of the applications and functions of system 900.

In one embodiment, memory subsystem 960 includes memory controller 964 (which could also be considered part of the control of system 900, and could potentially be considered part of processor 910). Memory controller 964 includes a scheduler to generate and issue commands to memory device 962. In one embodiment, test engine 966 is coupled to or part of memory subsystem 960, and provides memory test transactions to memory controller 964. The test transactions can cause memory controller 964 to schedule the transactions to provide deterministic testing of memory device 962. Test engine 966 enables transaction-level memory testing in memory subsystem 960 in accordance with any embodiment described herein. The testing can be performed in-system, with the memory devices connected into a hardware platform in which they will be used in runtime.

Connectivity 970 includes hardware devices (e.g., wireless and/or wired connectors and communication hardware) and software components (e.g., drivers, protocol stacks) to enable device 900 to communicate with external devices. The device could be separate devices, such as other computing devices, wireless access points or base stations, as well as peripherals such as headsets, printers, or other devices.

Connectivity 970 can include multiple different types of connectivity. To generalize, device 900 is illustrated with cellular connectivity 972 and wireless connectivity 974. Cellular connectivity 972 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 974 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 980 include hardware interfaces and connectors, as well as software components (e.g., drivers, protocol stacks) to make peripheral connections. It will be understood that device 900 could both be a peripheral device ("to" 982) to other computing devices, as well as have peripheral devices ("from" 984) connected to it. Device 900 commonly has a "docking" connector to connect to other computing devices for purposes such as managing (e.g., downloading and/or uploading, changing, synchronizing) content on device 900. Additionally, a docking connector can allow device 900 to connect to certain peripherals that allow device 900 to control content output, for example, to audiovisual or other systems.

In addition to a proprietary docking connector or other proprietary connection hardware, device 900 can make peripheral connections 980 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one aspect, a method includes adjusting a refresh rate of a host memory subsystem on a host hardware platform to a frequency lower than specified by a standard for a memory device included in the host memory subsystem; identifying specific bits of the memory device that produce errors when the host memory subsystem uses the lower frequency refresh rate; mapping out the identified specific bits to disallow use of the identified specific bits in runtime operation of the host memory subsystem; and setting the refresh rate of the host memory subsystem to the adjusted lower frequency.

In one embodiment, adjusting the refresh rate comprises adjusting a self-refresh rate. In one embodiment, the standard for the memory device comprises a dual data rate (DDR) standard for a dynamic random access memory (DRAM). In one embodiment, detecting specific bits comprises identifying an address region of the memory device. In one embodiment, detecting specific bits further comprises performing a stress test on the memory device including controlling environmental conditions of the host memory subsystem. In one embodiment, controlling environmental conditions comprises indirectly controlling the environmental conditions. In one embodiment, controlling environmental conditions comprises controlling one or more of a temperature or an operating voltage. In one embodiment, detecting specific bits further comprises performing a stress test on the memory device including measuring environmental conditions of the host memory subsystem. In one embodiment, the method further includes extrapolating measured values to determine performance of the memory device in worst case conditions.

In one embodiment, mapping out the detected specific bits further comprises marking the detected specific bits invalid. In one embodiment, mapping out the detected specific bits further comprises remapping the detected specific bits to spare bits of the memory device. In one embodiment, mapping out the detected specific bits further comprises remapping the detected specific bits in a memory controller of the memory subsystem. In one embodiment, remapping the detected specific bits comprises remapping the detected specific bits to a reserved region of the memory device. In one embodiment, remapping the detected specific bits comprises remapping the detected specific bits to an alternative memory storage location. In one embodiment, mapping out the detected specific bits further comprises remapping the detected specific bits in a host operating system of the host hardware platform. In one embodiment, mapping out the detected specific bits comprises mapping out a number of bits that can be remapped, starting with bits that fail first.

In one aspect, an apparatus includes a host hardware platform including a processor; a memory subsystem on the host hardware platform including a memory device, the memory subsystem having a refresh rate specified by a standard; a test engine embedded in the memory subsystem to adjust the refresh rate to a frequency lower than specified by the standard, identify specific bits of the memory device that produce errors when the memory subsystem uses the lower frequency refresh rate, and map out the identified specific bits to disallow use of the identified specific bits in runtime operation of the memory subsystem, wherein the memory subsystem is to set the refresh rate of the memory subsystem to the adjusted lower frequency for runtime operation of the host hardware platform.

In one embodiment, the test engine is to detect specific bits including identifying an address region of the memory device. In one embodiment, the test engine is to map out the detected specific bits including remapping the detected specific bits to spare bits of the memory device, to a reserved region of the memory device, or to an alternative memory storage location. In one embodiment, the test engine is to map out the detected specific bits including remapping the detected specific bits in a memory controller of the memory subsystem or a host operating system of the host hardware platform.

In one aspect, an electronic system includes a host hardware platform including a processor; a memory subsystem on the host hardware platform including a memory device, the memory subsystem having a refresh rate specified by a standard; a test engine embedded in the memory subsystem to adjust the refresh rate to a frequency lower than specified by the standard, identify specific bits of the memory device that produce errors when the memory subsystem uses the lower frequency refresh rate, and map out the identified specific bits to disallow use of the identified specific bits in runtime operation of the memory subsystem, wherein the memory subsystem is to set the refresh rate of the memory subsystem to the adjusted lower frequency for runtime operation of the host hardware platform; and a touchscreen display coupled to generate a display based on data stored in the memory subsystem.

In one embodiment, the test engine is to map out the detected specific bits including remapping the detected specific bits to spare bits of the memory device, to a reserved region of the memory device, or to an alternative memory storage location. In one embodiment, the test engine is to map out the detected specific bits including remapping the detected specific bits in a memory controller of the memory subsystem or a host operating system of the host hardware platform.

Flow diagrams as illustrated herein provide examples of sequences of various process actions. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A method comprising:
adjusting, by a host side test engine within a memory controller and/or on a processor side of the memory controller when the memory controller is coupled to a memory device, a refresh rate of the memory device to a frequency that is lower than a minimum specified frequency for the memory device;
identifying specific bits of the memory device that produce errors when the memory device operates according to the lower frequency refresh rate;
mapping out the identified specific bits to disallow use of the identified specific bits by the memory device in runtime operation; and
setting the refresh rate of the memory device to the adjusted lower frequency.

2. The method of claim 1, wherein adjusting the refresh rate comprises adjusting a self-refresh rate.

3. The method of claim 1, wherein the standard for the memory device comprises a dual data rate (DDR) standard for a dynamic random access memory (DRAM).

4. The method of claim 1, wherein detecting specific bits comprises identifying an address region of the memory device.

5. The method of claim 1, further comprising performing a stress test on the memory device including controlling environmental conditions of the host memory subsystem.

6. The method of claim 5, wherein controlling environmental conditions comprises indirectly controlling the environmental conditions.

7. The method of claim 5, wherein controlling environmental conditions comprises controlling one or more of a temperature and an operating voltage.

8. The method of claim 1, wherein the method further comprises performing a stress test on the memory device including measuring environmental conditions of the host memory subsystem.

9. The method of claim 8, further comprising extrapolating measured values to determine performance of the memory device in worst case conditions.

10. The method of claim 1, wherein mapping out the detected specific bits further comprises:
marking the detected specific bits invalid.

11. The method of claim 1, wherein mapping out the detected specific bits further comprises:
remapping the detected specific bits to spare bits of the memory device.

12. The method of claim 1, wherein mapping out the detected specific bits further comprises:
remapping the detected specific bits in a memory controller of the memory subsystem.

13. The method of claim 1, wherein remapping the detected specific bits comprises:
remapping the detected specific bits to a reserved region of the memory device.

14. The method of claim 1, wherein remapping the detected specific bits comprises:
remapping the detected specific bits to an alternative memory storage location.

15. The method of claim 1, wherein mapping out the detected specific bits further comprises:
remapping the detected specific bits in a host operating system that runs on the processor.

16. The method of claim 1, wherein mapping out the detected specific bits comprises:
mapping out a number of bits that can be remapped, starting with bits that fail first.

17. An apparatus comprising:
a host hardware platform including a processor and a memory controller;
a memory subsystem including a memory device, the memory device coupled to the memory controller, the memory device having a minimum specified refresh rate;
a test engine embedded in the memory controller and/or on the processor side of the memory controller and being coupled to an input of the memory controller to adjust the refresh rate to a frequency that is lower than minimum specified refresh rate, the host hardware platform to identify specific bits of the memory device that produce errors when the memory subsystem uses the lower frequency refresh rate, the host hardware platform to map out the identified specific bits to disallow use of the identified specific bits by the memory device in runtime operation,
the host hardware platform to set the refresh rate of the memory subsystem to the adjusted lower frequency for runtime operation.

18. The apparatus of claim 17, wherein the test engine is to detect specific bits including identifying an address region of the memory device.

19. The apparatus of claim 17, wherein the test engine is to map out the detected specific bits including remapping the detected specific bits to spare bits of the memory device, to a reserved region of the memory device, or to an alternative memory storage location.

20. The apparatus of claim 17, wherein the test engine is to map out the detected specific bits including remapping the detected specific bits in the memory controller of the memory subsystem or a host operating system of the host hardware platform.

21. An electronic device comprising:
a host hardware platform including a processor and a memory controller;
a memory device coupled to the memory controller, the memory device having a specified minimum refresh rate;
a test engine embedded in the memory controller and/or on the processor side of the memory controller and coupled to an input of the memory controller, the test engine to adjust the refresh rate to a frequency lower than the minimum specified refresh rate, the test engine to identify specific bits of the memory device that produce errors when the memory subsystem uses the lower frequency refresh rate, and map out the identified specific bits to disallow use of the identified specific bits in runtime operation,
the host hardware platform to set the refresh rate of the memory device to the adjusted lower frequency for runtime operation; and
a touchscreen display coupled to generate a display based on data stored in the memory subsystem.

22. The electronic device of claim 21, wherein the test engine is to remap the detected specific bits to spare bits of the memory device, to a reserved region of the memory device, or to an alternative memory storage location.

23. The electronic device of claim 21, wherein the test engine is to remap the detected specific bits in a memory controller of the memory subsystem or a host operating system of the host hardware platform.

* * * * *